(12) United States Patent
Lim et al.

(10) Patent No.: US 9,171,897 B1
(45) Date of Patent: Oct. 27, 2015

(54) AREA EFFICIENT SERIES MIM CAPACITOR

(71) Applicant: Altera Corporation, San Jose, CA (US)

(72) Inventors: Queennie Suan Imm Lim, Sunnyvale, CA (US); Dale Ibbotson, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 197 days.

(21) Appl. No.: 13/936,245

(22) Filed: Jul. 8, 2013

(51) Int. Cl.
*H01L 21/20* (2006.01)
*H01L 21/02* (2006.01)
*H01L 49/02* (2006.01)

(52) U.S. Cl.
CPC ..................... *H01L 28/40* (2013.01)

(58) Field of Classification Search
CPC ............................ H01L 23/5223; H01L 28/40
See application file for complete search history.

(56) References Cited

U.S. PATENT DOCUMENTS

| 2004/0124496 | A1* | 7/2004 | Rao et al. | 257/532 |
| 2010/0065944 | A1* | 3/2010 | Tu et al. | 257/532 |
| 2010/0327410 | A1* | 12/2010 | Park et al. | 257/534 |

* cited by examiner

*Primary Examiner* — Whitney T Moore
*Assistant Examiner* — Joseph Galvin, III
(74) *Attorney, Agent, or Firm* — Ward & Zinna, LLC (57) ABSTRACT

Two series-connected metal-insulator-metal (MIM) capacitors are disclosed that are suitable for fabrication in the back-end structure of an integrated circuit. The MIM capacitors have first and second electrically conducting plates on a first insulating layer, third and fourth electrically conducting plates overlapping the first and second conducting plates, a second insulating layer between the first and third conducting plates and between the second and fourth conducting plates, a blind via coupling the first and fourth conducting plates, and connections to the second and third conducting plates. Methods of fabricating such series-connected MIM capacitors are also disclosed.

21 Claims, 5 Drawing Sheets

AREA EFFICIENT SERIES MIM CAPACITOR

BACKGROUND

A typical integrated circuit comprises a semiconductor substrate and a back-end structure formed on one surface of the semiconductor substrate. Transistors are formed in the semiconductor substrate and are connected together and to external connections by a network of interconnects that extends through insulating layers in the back-end structure. Further details about the back-end technologies in integrated circuits may be found, for example, in J. D. Plummer et al., *Silicon VLSI Technology*, Ch. 11 (Prentice Hall 2000) which is incorporated by reference herein.

Circuit elements such as resistors, capacitors, and inductors are frequently formed in the back-end structure. This concerns capacitors that are sometimes referred to as MIM (Metal-Insulating-Metal) capacitors. They are often used as decoupling capacitors.

In some cases it is desirable to connect MIM capacitors in series. One such series MIM capacitor comprises a first electrically conducting plate, second and third electrically conducting plates located side-by-side above the first plate, and an insulating layer between the first plate and the other two plates. Typically, the first plate has the same lateral extent as the second and third plates. External connections are made to each of the second and third plates.

Unfortunately, this arrangement causes one of the two capacitors to be forward biased while the other is reverse biased. It also has an asymmetrical leakage current which leads to concerns about its reliability.

In an alternative embodiment, two identical capacitors are formed each having lower and upper plates with an insulating layer between them; and the lower plate of the first capacitor is connected to the upper plate of the second capacitor using a laterally extending pathway located above the two capacitors. External connections are also made to the upper plate of the first capacitor and the lower plate of the second capacitor. To provide connection space on the surface of the lower plates, the lower plates must extend laterally beyond at least one edge of the upper plates. These lateral extensions and the spacing between the lower plates result in an inefficient use of available space.

SUMMARY

The present invention relates to improved series-connected MIM capacitors.

In a preferred embodiment, two series-connected MIM capacitors comprise: first and second electrically conducting plates on a first insulating layer, third and fourth electrically conducting plates overlapping the first and second conducting plates, a second insulating layer between the first and third conducting plates and between the second and fourth conducting plates, a blind via coupling the first and fourth conducting plates, and connections to the second and third conducting plates. Advantageously, the MIM capacitors are located in one of the insulating layers formed in the back-end structure on one surface of the semiconductor substrate of an integrated circuit.

Methods of fabricating such series-connected MIM capacitors are also disclosed.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
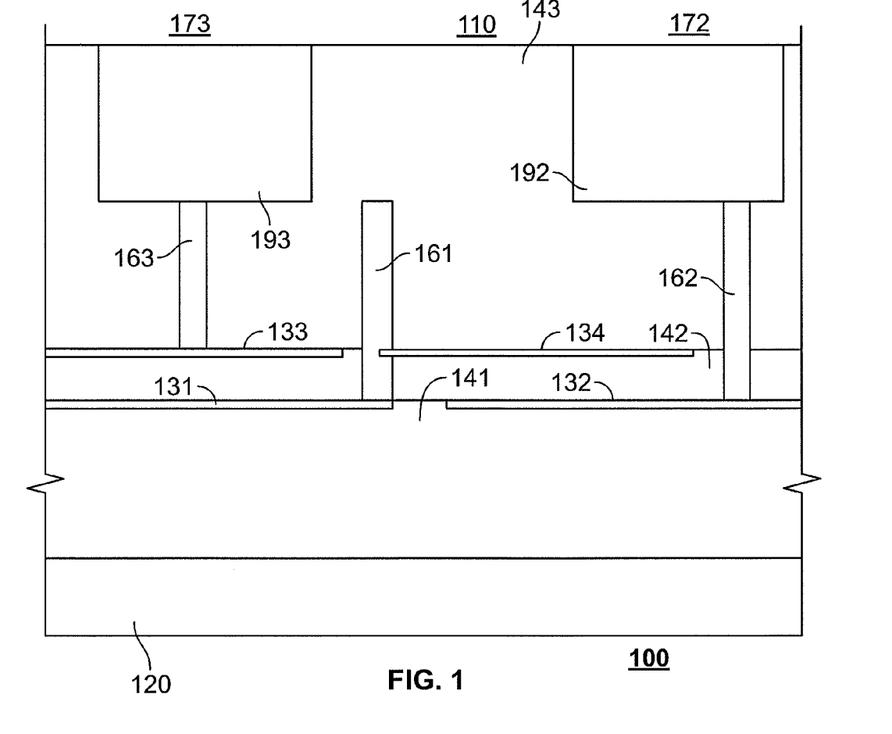
FIG. 1 is a cross-section of a first illustrative embodiment of the invention.

FIG. 1 is a cross-section of a first illustrative embodiment 100 of the invention formed in one of the insulating layers found in a back-end structure 110 on a semiconductor substrate 120 in a typical integrated circuit. It will be understood that FIG. 1 is not to scale and is not intended to be an accurate representation of the relative dimensions of the elements depicted therein or the distances between them.

Embodiment 100 comprises: first and second electrically conducting plates 131, 132 formed on a first insulating layer 141 that is one of a plurality of insulating layers in the back-end structure; third and fourth electrically conducting plates 133, 134 formed above the first and second conducting plates 131, 132, respectively; a second insulating layer 142 between the first and third conducting plates 131, 133 and between the second and fourth conducting plates 132, 134; at least one blind via 161 coupling the first conducting plate 131 to the fourth conducting plate 134; and connections 172, 173 to the second and third conducting plates 132, 133. Illustratively, connections 172, 173 include one or more vias 162, 163 that extend through a third insulating layer 143 to couple plates 132, 133 to first and second electrically conducting paths 192, 193, respectively, that are part of the interconnect network in the back-end structure.

As shown in FIG. 1, in the direction visible in the cross-section, first plate 131 extends beyond third plate 133 and fourth plate 134 extends beyond second plate 132 enough that first plate 131 and fourth plate 134 overlap slightly by a fraction of the width of via 161. One or more blind vias 161 connects the extended portion of first plate 131 to the extended portion of fourth plate 134. In addition, second plate 132 extends beyond at least one edge of fourth plate 134 to provide space where connections 172 can contact plate 132.

Figure 2:
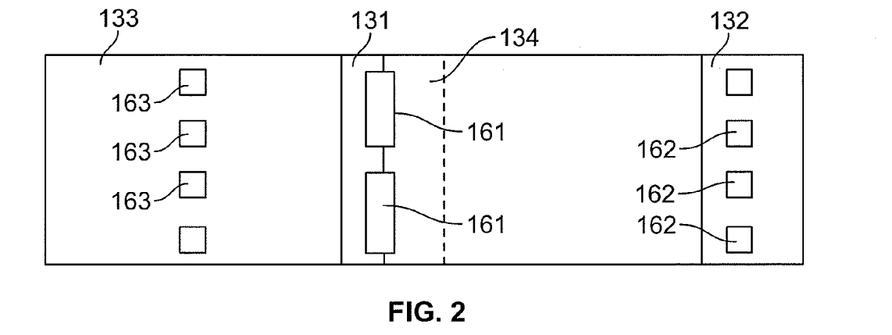
FIG. 2 is a top view of the first illustrative embodiment.

FIG. 2 is a top view of some of the structure depicted in the cross-section of FIG. 1. In FIG. 2, the same element numbers used in FIG. 1 are again used to identify the same structural elements. Third plate 133 is located directly above first plate 131 with a portion of plate 131 extending out beyond plate 133 toward second plate 132. Likewise, fourth plate 134 is located directly above second plate 132 with a portion of plate 134 extending beyond plate 132 toward plate 133. The extended portions of plates 131 and 134 overlap slightly and a plurality of blind vias 161 are shown that connect plates 131 and 134. Illustratively, vias 161 are slotted so that they have a transverse cross-section that is rectangular. Also shown in FIG. 2 are connections 172 to plate 132 and connections 173 to plate 133.

Illustratively, the four plates 131, 132, 133, 134 and the vias 161, 162, 163 are made of a metal nitrate such as titanium nitrate (TiN). Other conductors might also be used. First and third insulating layers are conventional intermetallic dielectric (IMD) layers made of insulating materials such as silicon dioxide (SiO2) or, where desired, low-k dielectric materials. Second insulating layer 142 preferably is a high-k dielectric material such as zirconium oxide (ZrO2) or hafnium alumina oxide (HfAlO). Other dielectrics may also be used. Suitable such materials are well known. Conducting paths 192, 193 are conventional metal conductors such as copper or aluminum.

Figure 3:
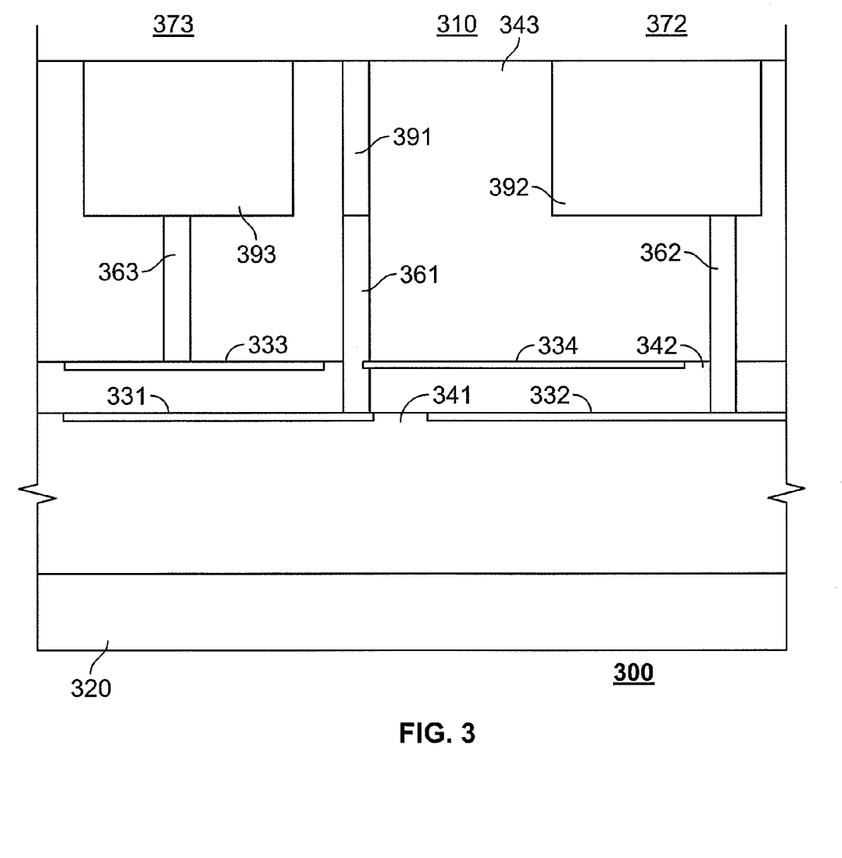
FIG. 3 is a cross-section of a second illustrative embodiment of the invention.

FIG. 3 is a cross-section of a second illustrative embodiment 300 of the invention formed in an insulating layer in a back-end structure 310 on a semiconductor substrate 320 in a typical integrated circuit. Except for element 391, embodiment 300 is the same as embodiment 100 and comprises the same elements bearing the same element numbers increased by 200.

Element 391 is a stacked via 391 formed on top of and in ohmic contact with at least one of vias 361. The stacked via is formed in the same layer of conducting material and at the same time as the conducting paths 392, 393. The stacked via can provide additional parasitic capacitance for the series-connected MIM capacitor.

Suitable materials for the conducting plates, insulating layers, conducting paths and vias are the same as those described above for the embodiment of FIGS. 1 and 2.

Figure 4:
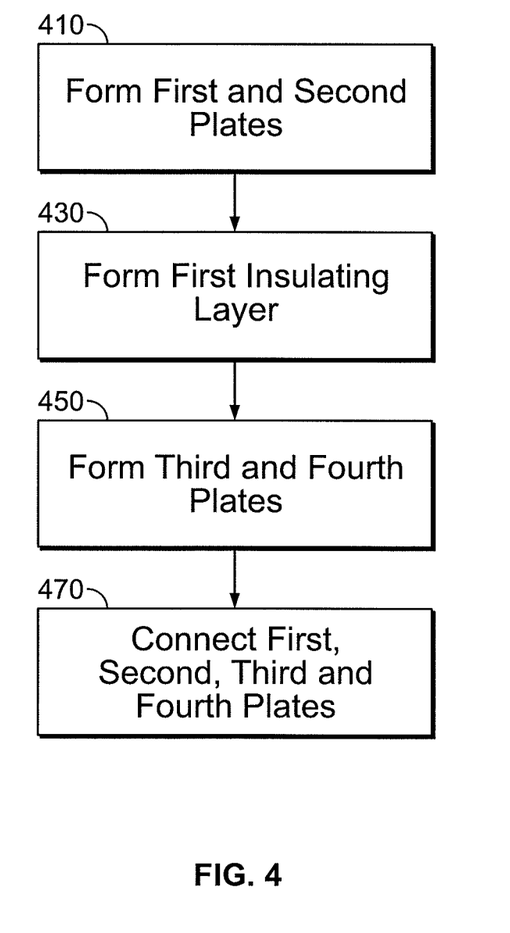
FIG. 4 is a flow chart depicting a first illustrative method of making the embodiments of FIGS. 1 and 3.

FIG. 4 is a flow chart depicting a first illustrative method of making the embodiments of FIGS. 1 and 3. The method is practiced on a wafer of a semiconductor material, typically monocrystalline silicon, in which a plurality of identical integrated circuits are being defined. Each integrated circuit comprises a multitude of transistors that are formed in the semiconductor substrate and a back-end structure comprising one or more tiers of insulating layers and conducting layers on the surface of the substrate that have been shaped to define conducting pathways that connect the transistor elements in the semiconductor substrate to each other and to external circuitry. The starting point for the method of FIG. 4 is a semiconductor wafer in which the transistors have been fabricated and one or more layers of insulating material and conducting material have been formed with the uppermost layer being a layer of insulating material that has been polished flat. This uppermost insulating layer has been and will be referred to as the first insulating layer although it will be recognized by those skilled in the art that one or more additional layers of insulating material may underlie the first insulating layer.

The method of FIG. 4 begins at step 410 with the formation of the first and second lower conducting plates in the first insulating layer using conventional photolithographic processes. At step 430, a second insulating layer is formed on the first and second plates and any portion of the first insulating layer that is not covered by these plates. At step 450, the third and fourth upper conducting plates are formed in the second insulating layer again using conventional photolithographic processes. At step 470 the first and fourth plates are connected by a blind via; and connections are made to the second and third plates.

Figure 5:
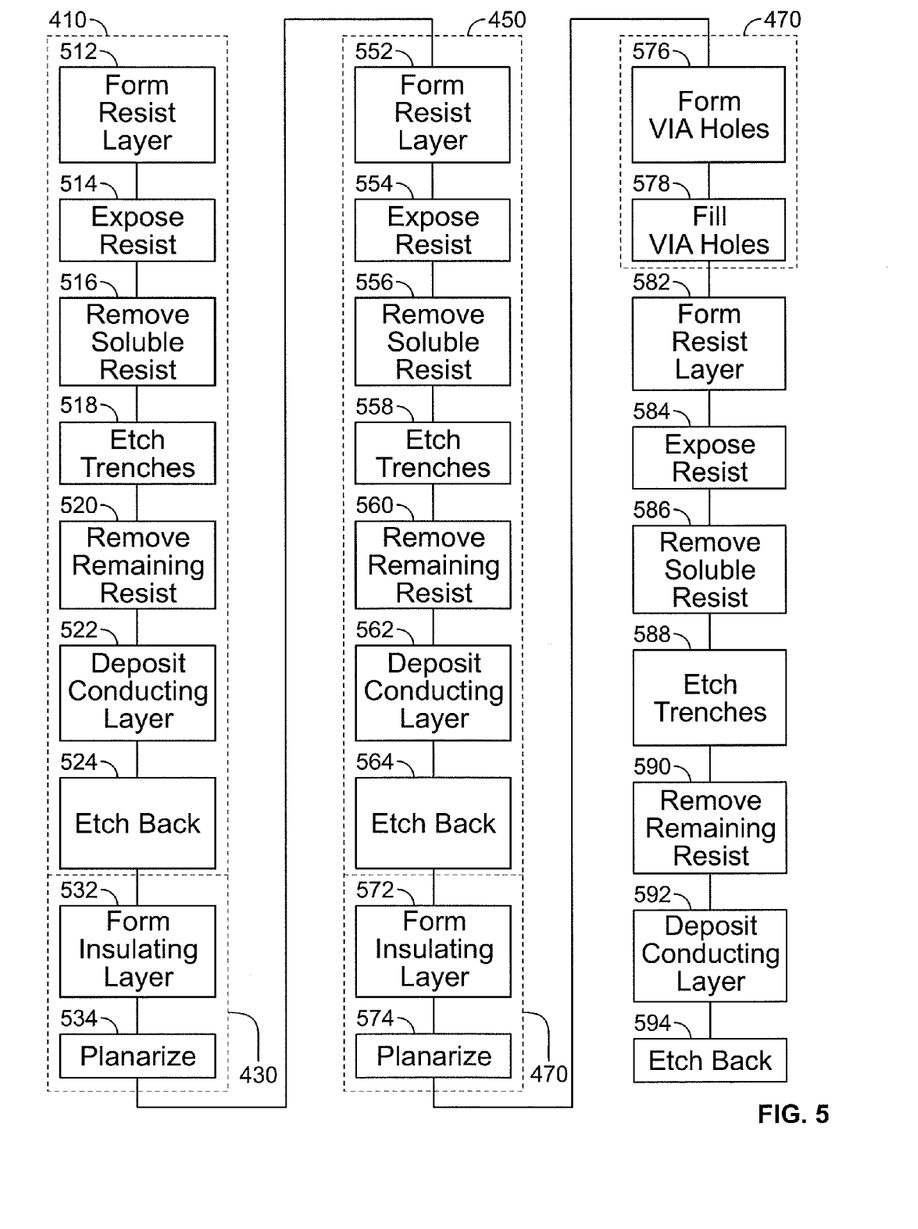
FIG. 5 is a flow chart depicting further details of a first embodiment of the method of FIG. 4.
Figure 6:
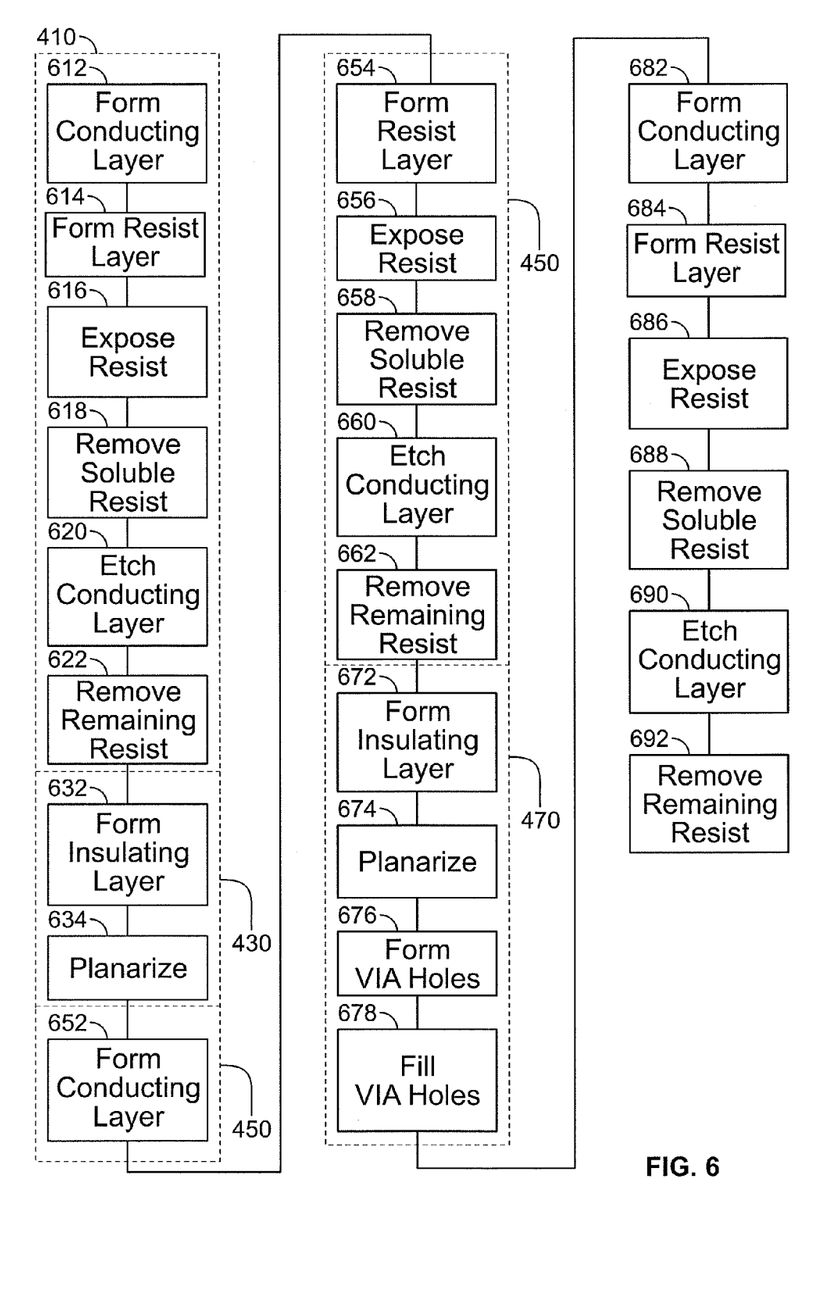
FIG. 6. is a flow chart depicting further details of a second embodiment of the method of FIG. 4.

Steps 410, 430, 450, and 470 may be performed in different ways. A damascene process is depicted in FIG. 5. An etch process is depicted in FIG. 6. In the process of FIG. 5, step 410 begins at step 512 with the formation of a layer of photoresist on the flat first layer of insulating material on the upper surface of the wafer. At step 514, this photoresist layer is then exposed through a mask to actinic radiation to define the shape of the first and second plates in the photoresist. If a positive photoresist is used, the radiation solubilizes the photoresist; but if a negative photoresist is used, the radiation hardens the photoresist. The soluble portions of the photoresist are then removed at step 516 to expose the underlying surface of the first insulating layer where the first and second plates are to be formed. At step 518, the underlying surface is etched to form trenches where the first and second plates are to be formed. The photoresist remaining on the first insulating layer is then removed at step 520. Next, a layer of conducting material is formed at step 522 on the exposed surfaces of the trenches and the first insulating layer. Finally, an etchback is performed at step 524 on the conducting layer to remove all of the conducting material except the material that was deposited in the trenches. Typically, the etchback is made using chemical mechanical polishing (CMP).

Step 430 provides a second insulating layer. At step 532, the second insulating layer is formed on the first and second plates and the portion of the first layer not covered by these plates. At step 534, the second insulating layer is planarized, typically using CMP, to form a flat upper surface.

Details of step 450 are similar to those of step 410. Step 450 begins at step 552 with the formation of a layer of photoresist on the flat upper surface of the second insulating layer. At step 554, this layer is exposed through a mask to actinic radiation to define the shape of the third and fourth plates in the photoresist. Soluble portions of the photoresist are then removed at step 556, to expose the underlying surface of the second insulating layer where the third and fourth plates are to be formed. At step 558, the underlying surface is etched to form trenches where the third and fourth plates are to be formed. The photoresist remaining on the second insulating layer is removed at step 560. A layer of conducting material is then formed at step 562 on the exposed surfaces of the trenches and second insulating layer. Finally, an etchback is performed at step 564 on the conducting layer to remove all of the conducting material except the material that was deposited in the trenches.

Step 470 provides a third insulating layer and vias therethrough. At step 572, a third insulating layer is formed on the third and fourth plates and the portions of the second insulating layer not covered by these plates. At step 574, the third insulating layer is planarized, typically using CMP, to form a flat upper surface. Via holes are then formed at step 576 that extend from the upper surface of the third insulating layer to the first, second, third, and fourth plates. These holes are then filled at step 578 with a conducting material.

Additional processing steps are then performed to connect the capacitor to the interconnects in the back-end structure. For example, at step 582, a layer of photoresist is formed on the flat upper surface of the third insulating layer. At step 584, this layer is exposed through a mask to actinic radiation to define the shape of first and second conducting paths in the photoresist. The paths are located over the vias that couple to the second and third plates. Soluble portions of the photoresist are then removed at step 586, to expose the underlying surface of the third insulating layer where the first and second paths are to be formed. At step 588, the underlying surface is etched to form trenches where the first and second paths are to be formed. The photoresist remaining on the third insulating layer is removed at step 590. A layer of conducting material is then formed at step 592 on the exposed surfaces of the trenches and third insulating layer. Finally, an etchback is performed at step 594 on the conducting layer to remove all of the conducting material except the material that was deposited in the trenches. The conducting material in the trenches forms two conducting paths that are connected by the vias to the second and third plates of the capacitors.

If the third insulating layer is the uppermost insulating layer, steps similar to steps 582-594 may be used to form bonding pads instead of connecting paths and connect the pads to the capacitor plates using vias. Otherwise, additional layers of conducting material are formed in additional layers of insulating material and connected by vias until the uppermost insulating layer is reached.

As will be appreciated by those skilled in the art, the foregoing steps are performed on the entire wafer to form at the same time the elements of the series-connected MIM capacitors in all the integrated circuits being formed in that wafer.

In the case of the embodiment of FIG. 3, the same process steps described above are used but an additional trench is formed at step 588 above via 361 that connects the first and fourth plates. When a layer of conducting material is formed in the trenches at step 592, the conducting material also forms an ohmic contact with via 561.

As an alternative to step 578 where the via holes are filled in a separate operation before the conducting paths are formed, the filling of the via holes can be deferred; and the via holes can be filled in a dual damascene process at the same time that the layer of conducting material is formed at step 592.

The damascene process detailed in FIG. 5 is particularly useful where the conducting material is difficult to etch. With conducting materials such as aluminum that are not difficult to etch, the process of FIG. 6 may be used.

FIG. 6 is a flow chart depicting a second illustrative embodiment of the method of FIG. 4. Again, the starting point is a wafer in which the transistors have been fabricated and one or more layers of insulating material and conducting material have been formed with the uppermost layer being a layer of insulating material that has been polished flat. This uppermost layer is again referred to as the first insulating layer.

In the process depicted in FIG. 6, step 410 begins at step 612 with the formation of a first conducting layer on the first insulating layer. At step 614, a layer of photoresist is formed on the first conducting layer. At step 616, this photoresist layer is then exposed through a mask to actinic radiation to define the shape of the first and second plates in the photoresist. The soluble portions of the photoresist are then removed at step 618 to expose those portions of the underlying first conducting layer where the first and second plates are not to be formed. At step 620, the underlying surface is etched to remove the exposed portions of the conducting layer. The photoresist remaining on the conducting layer is then removed at step 622 leaving the first and second plates.

Step 430 provides a second insulating layer. At step 632, the second insulating layer is formed on the first and second plates and the portion of the first insulating layer not covered by these plates. At step 634, the second insulating layer is planarized, typically using CMP, to form a flat upper surface.

Details of step 450 are similar to those of step 410. Step 450 begins at step 652 with the formation of a second conducting layer on the second insulating layer. At step 654, a layer of photoresist is formed on the second conducting layer. At step 656, this photoresist layer is then exposed through a mask to actinic radiation to define the shape of the third and fourth plates in the photoresist. The soluble portions of the photoresist are then removed at step 658 to expose those portions of the underlying second conducting layer where the third and fourth plates are not to be formed. At step 660, the underlying surface is etched to remove the exposed portions of the conducting layer. The photoresist remaining on the second conducting layer is then removed at step 662 leaving the third and fourth plates.

Step 470 provides a third insulating layer and vias therethrough. At step 672, a third insulating layer is formed on the third and fourth plates and the portions of the second insulating layer not covered by these plates. At step 674, the third insulating layer is planarized, typically using CMP. Via holes are then formed at step 676 that extend from the upper surface of the third insulating layer to the first, second, third, and fourth plates. These holes are then filled at step 678 with a suitable conducting material.

Additional processing steps are then performed to connect the capacitor to the interconnects in the back-end structure. For example, at step 682, a third conducting layer is formed on the third insulating layer. At step 684, a layer of photoresist is formed on the third conducting layer. At step 686, this photoresist layer is then exposed through a mask to actinic radiation to define the shape of first and second conducting paths in the photoresist. The paths are located over the vias that couple to the second and third plates. The soluble portions of the photoresist are then removed at step 688 to expose those portions of the underlying third conducting layer where the first and second conducting paths are not to be formed. At step 690, the underlying surface is etched to remove the exposed portions of the conducting layer. The photoresist remaining on the third conducting layer is then removed at step 692 leaving the two conducting paths that are connected by the vias to the second and third plates of the capacitors.

If the third insulating layer is the uppermost insulating layer, steps similar to steps 682-692 may be used to form bonding pads instead of connecting paths and connect the pads to the capacitor plates using vias. Otherwise, additional layers of conducting material and insulating material are formed until the uppermost insulating layer is reached.

As in the case of the process of FIG. 5, the foregoing steps are performed on the entire wafer to form at the same time the series-connected MIM capacitors in all the integrated circuits being formed in that wafer.

In the case of the embodiment of FIG. 3, the same process steps described above are used but at the same time that the two conducting paths are formed at steps 682-692 a stacked via is formed above and in ohmic contact with via 361.

As will be apparent to those skilled in the art, numerous variations may be practiced within the spirit and scope of the present invention. For example, while the invention has been described in the context of silicon fabrication technology, the invention may also be practiced for other semiconductor fabrication technologies such as Gallium Arsenide and other III-V material systems.

While one set of similar process steps have been described for forming the plates and conducting paths in the embodiment of FIG. 5 and a different set of similar process steps has been described for performing the same functions in the embodiment of FIG. 6, it will be understood that some of the process steps described in conjunction with FIG. 5 may be used with some of the process steps described in FIG. 6 especially where different metals are used in the conducting layers. Further, it will also be understood that the order of certain steps may be varied In the interest of simplicity and to avoid obscuring the invention, only the major steps of the semiconductor fabrication processes have been described. It will be understood that many additional steps and details have been omitted as unnecessary for an understanding of the invention. For example, details of many of these processes are set forth in the above-referenced textbook of Plummer, which is incorporated by reference herein.

Specific details of the insulating layers, the conducting vias, and the conducting layers have not been supplied because many such details are well known in the industry. While the embodiments have been described in terms of single layers, it will be understood that the single layers may be formed of multiple sub-layers that provide a multiplicity of functions such as adhesion and barrier layers. It will also be understood that the MIM capacitors of the present invention may be located in any of the conducting layers on the integrated circuit.

What is claimed is:

1. A metal-insulator-metal (MIM) capacitor comprising:
   first and second conducting plates formed adjacent one another on a first insulating layer on a semiconductor substrate;
   third and fourth conducting plates formed adjacent one another above the first and second conducting plates, respectively, a first portion of the first conducting plate extending beyond the third conducting plate toward the second conducting plate and a first portion of the fourth conducting plate extending beyond the second conducting plate toward the third conducting plate so that there is some overlap of the first portions of the first and fourth conducting plates;
   a second insulating layer between the first and third conducting plates and between the second and fourth conducting plates;
   at least one blind via coupling the first portion of the first conducting plate to the first portion of the fourth conducting plate; and
   circuitry coupling the second and third conducting plates to other connections.

2. The capacitor of claim 1 where the blind via has a transverse cross-section that is rectangular.

3. The capacitor of claim 1 wherein the circuitry coupling the second and third conducting plates comprises:
   a first via coupling said third conducting plate to a first conducting path above the third and fourth plates; and
   a second via coupling the second conducting plate to a second conducting path above the second and third plates.

4. The capacitor of claim 1 further comprising a stacked via connected to at least one of the blind vias.

5. The capacitor of claim 1 wherein the conducting plates are made of a nitrate material.

6. An integrated circuit comprising a semiconductor substrate and a back-end structure on one surface of the semiconductor substrate, said circuit comprising:
   first and second conducting plates formed adjacent one another in a first insulating layer in the back-end structure on the semiconductor substrate;
   third and fourth conducting plates formed adjacent one another above the first and second conducting plates, the third conducting plate overlapping the first conducting plate and the fourth conducting plate overlapping the second conducting plate, a first portion of the first conducting plate extending beyond the third conducting plate toward the second conducting plate and a first portion of the fourth conducting plate extending beyond the second conducting plate toward the third conducting plate so that there is some overlap of the first portions of the first and fourth conducting plates;
   a second insulating layer between the first and third conducting plates and between the second and fourth conducting plates;
   at least one blind via coupling the first portion of the first conducting plate to the first portion of the fourth conducting plate; and
   circuitry coupling the second and third conducting plates to other connections.

7. The integrated circuit of claim 6 wherein the blind via has a transverse cross-section that is rectangular.

8. The integrated circuit of claim 6 wherein the circuitry coupling the second and third conducting plates to other connections comprises:
   a first via coupling said third conducting plate to a first conducting path above the third and fourth conducting plates;
   a second via coupling the second conducting plate to a second conducting path above the third and fourth conducting plates.

9. The integrated circuit of claim 6 further comprising a stacked via connected to at least one of the blind vias.

10. The integrated circuit of claim 6 wherein the conducting plates are made of a nitrate material.

11. A method for making a series-connected metal-insulator-metal (MIM) capacitor comprising:
    forming first and second conducting plates adjacent one another on an upper surface of a first insulating material;
    forming a second insulating layer on the first and second conducting plates;
    forming third and fourth conducting plates adjacent one another on an upper surface of the second insulating layer where the third conducting plate overlaps the first conducting plate and the fourth conducting plate overlaps the second conducting plate and a first portion of the first conducting plate extends beyond the third conducting plate toward the second conducting plate and a first portion of the fourth conducting plate extends beyond the second conducting plate toward the third conducting plate so that there is some overlap of the first portions of the first and fourth conductive plates; and
    connecting the first portions of the first and fourth conducting plates using a blind via.

12. The method of claim 11 further comprising the step of coupling the second and third plates to other connections.

13. The method of claim 12 wherein the step of coupling the second and third plates to other connections comprises:
    forming in at least one layer of insulating material first and second via holes that extend from an upper surface of said at least one layer of insulating material to the second and third conducting plates, respectively; and
    filling the first and second via holes with conducting material.

14. The method of claim 13 further comprising the step of forming conducting paths that couple to the filled first and second holes.

15. The method of claim 11 wherein the blind via has a transverse cross-section that is rectangular.

16. A method for making a series-connected metal-insulator-metal (MIM) capacitor comprising:
    forming first and second conducting plates on an upper surface of a first insulating material;
    forming a second insulating layer on the first and second conducting plates;
    forming third and fourth conducting plates on an upper surface of the second insulating layer where the third plate overlaps the first plate and the fourth plate overlaps the second plate; and
    connecting the first and fourth plates using a blind via,
    wherein the first and second conducting plates are formed by:
    etching the upper surface of the first insulating material to form first and second trenches;
    forming a layer of conducting material on the first and second trenches and the upper surface of the insulating material; and
    removing portions of the layer of conducting material that are not in the trenches.

17. The method of claim 16 wherein the conducting material is a nitrate.

18. The method of claim 11 wherein the first and second conducting plates are formed by:
forming a layer of conducting material on the upper surface of the first insulating material; and
etching away portions of the conducting material to leave first and second conducting plates.

19. The method of claim 18 wherein the conducting material is aluminum.

20. The method of claim 16 wherein:
forming third and fourth conducting plates on an upper surface of the second insulating layer comprises:
etching the upper surface of the second insulating layer to form third and fourth trenches;
forming a second layer of conducting material on the third and fourth trenches and the upper surface of the second insulating layer; and
removing portions of the second layer of conducting material that are not in the third and fourth trenches; and
connecting the first and fourth plates comprises:
forming a hole in the second insulating layer that extends between the first plate and the fourth plate; and
filling the hole with a conducting material.

21. The capacitor of claim 1 wherein the first insulating layer is flat.

* * * * *